(12) United States Patent
Park (10) Patent No.: US 7,393,750 B2
(45) Date of Patent: Jul. 1, 2008

(54) METHOD FOR MANUFACTURING A SEMICONDUCTOR DEVICE

(75) Inventor: Jeong Ho Park, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 3 days.

(21) Appl. No.: 11/615,652

(22) Filed: Dec. 22, 2006

(65) Prior Publication Data
US 2007/0148883 A1 Jun. 28, 2007

(30) Foreign Application Priority Data
Dec. 28, 2005 (KR) .................. 10-2005-0132340

(51) Int. Cl.
*H01L 21/8242* (2006.01)
*H01L 21/336* (2006.01)
(52) U.S. Cl. .................. 438/296; 438/248; 438/259; 438/270; 438/391; 257/E21.546; 257/E21.548
(58) Field of Classification Search ............... 438/296, 438/248, 259, 270, 391; 257/E21.546, E21.548
See application file for complete search history.

(56) References Cited
U.S. PATENT DOCUMENTS
6,180,467 B1 * 1/2001 Wu et al. .................... 438/296
7,297,609 B2 * 11/2007 Kim ........................... 438/427
2007/0004129 A1 * 1/2007 Lee et al. .................... 438/243

* cited by examiner

Primary Examiner—Michael S. Lebentritt
Assistant Examiner—Mohsen Ahmadi
(74) Attorney, Agent, or Firm—Sherr & Nourse, PLLC (57) ABSTRACT

Embodiments relate to a method of manufacturing a semiconductor device. According to embodiments, the method may include forming a first and a second insulating layer on a semiconductor substrate of which an active area and an isolation region are defined, forming a first and a second insulating layer pattern by selectively removing the first and the second insulating layer to expose the isolation region of the semiconductor substrate, forming a trench having a prescribed depth by selectively removing the semiconductor substrate by using the first and the second insulating layer pattern as a mask, forming an isolation layer as a third insulating layer in the trench, removing a prescribed thickness of the isolation layer from the surface portion through etching the whole semiconductor substrate while remaining at the side portions of the first and second insulating layer pattern and the active area as a side wall shape, removing the first and the second insulating layer pattern, and removing a prescribed thickness of the isolation layer from the surface portion to protrude the active area of the semiconductor substrate.

16 Claims, 6 Drawing Sheets

METHOD FOR MANUFACTURING A SEMICONDUCTOR DEVICE

The present application claims priority under 35 U.S.C. 119 and 35 U.S.C. 365 to Korean Patent Application No. 10-2005-0132340 (filed on Dec. 28, 2005), which is hereby incorporated by reference in its entirety.

BACKGROUND

As semiconductor devices become more highly integrated, it may be necessary to decrease a size of a transistor. There may be limitations, however, as to how shallow a junction depth of a source/drain may be formed.

As a channel length decreases from a long channel to a short channel of 0.5 µm or less, a depletion region of the source/drain region may penetrate into the channel to decrease the effective channel length and may decrease the threshold voltage. This may generate a short channel effect of losing a gate controlling function at a MOS transistor.

To prevent the short channel effect, a thickness of the gate insulating layer may be decreased, a channel between the source/drain (e.g. a maximum width of depletion region below the gate) may be decreased, and/or the impurity concentration within the semiconductor substrate may be decreased.

Forming a shallow junction may also be beneficial. To this end, an ion implantation apparatus and a subsequently implemented thermal treatment process to achieve a method for forming the shallow junction during forming semiconductor devices may be beneficial.

A MOS transistor may be a representative of a lightly doped drain (LDD) structure. A MOS transistor may generally be used for a memory semiconductor device (such as a DRAM). A MOS transistor may be a flat type transistor, and may include a gate insulating layer formed on a silicon substrate and a conductive pattern formed on the gate insulating layer.

As a level of integration of a semiconductor device increases, however, a line width of a gate pattern may decrease and a length and width of a channel may also decrease. This may increase a negative effect of the transistor operation such as a short channel effect or a narrow channel effect.

In addition, a drive current of an MOS transistor may flow through a substrate channel below a gate electrode of each cell. As the level of integration of a semiconductor device increases, a size of the device may gradually decrease, and the drive current may flow through a extremely limited depth and width near the gate electrode. Accordingly, an amount of drive current may be extremely limited, and may deteriorate operational characteristics of the transistor.

To address the short channel effect and the drive current limitation problem in the MOS transistor, a pin-type MOS transistor may be used. In a pin-type MOS transistor, an area of the substrate contacting the gate electrode having a shallow junction structure may be enlarged, which may increase the drive current.

A related art transistor of a semiconductor device will be described referring to attached drawings.

Figure 1:
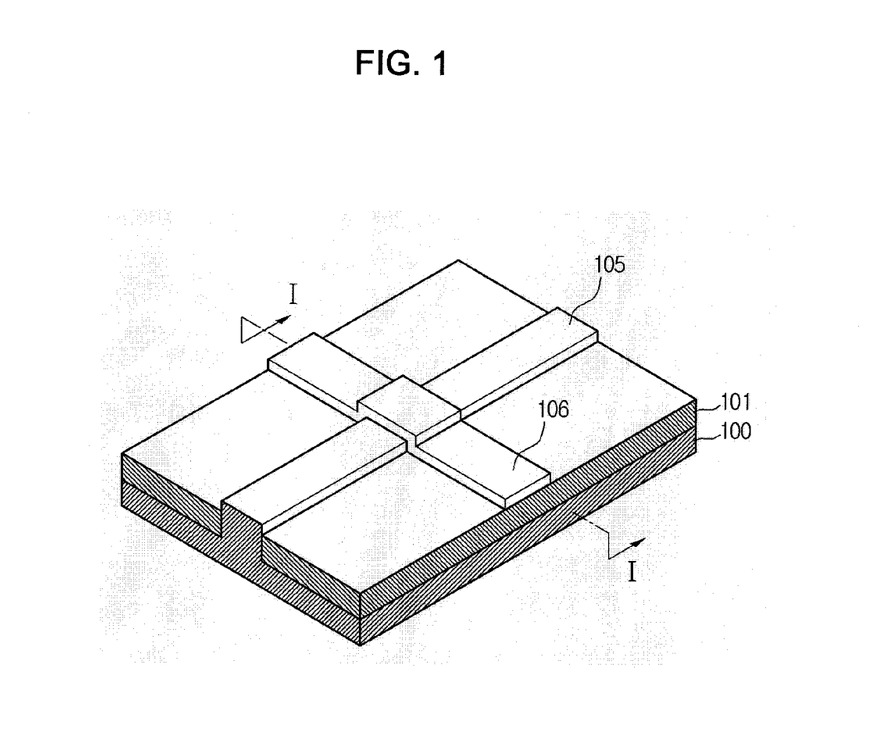
FIG. 1 is an example diagram illustrating a related art pin-type MOS transistor.
Figure 2:
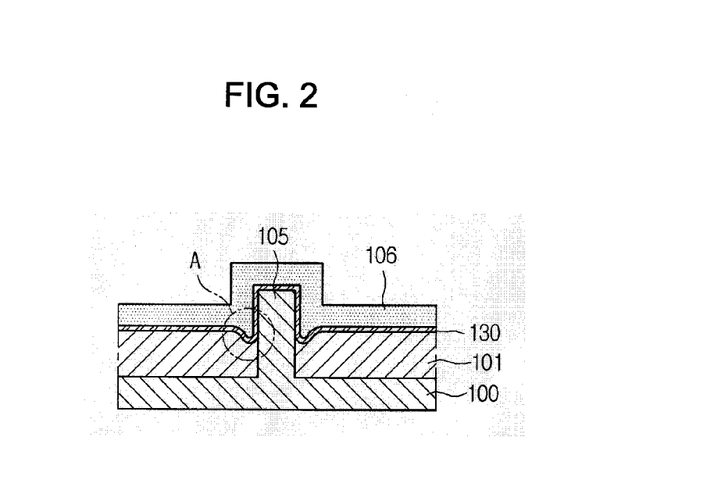
FIG. 2 is an example cross-sectional view taken along the line I-I of the pin-type MOS transistor illustrated in FIG. 1.

FIG. 1 is an example schematic diagram of a related art pin-type MOS transistor and FIG. 2 is an example cross-sectional view taken along the line I-I of the pin-type MOS transistor illustrated in FIG. 1.

Referring to FIGS. 1 and 2, a related art pin-type MOS transistor may include isolation layer 101 formed at an isolation region of semiconductor substrate 100. It may further include active area 105 that may protrude above an upper surface of isolation layer 101 and be formed along one direction. It may further include gate electrode 106 formed along a direction crossing the protruding active area 105, and may have gate insulating layer 130 between them. It may further include source/drain impurity regions formed in active area 105 at sides of gate electrode 106.

Source/drain impurity regions may be formed at active area 105 under gate electrode 106 with a channel region between them.

Gate electrode 106 may cover protruded active area 105, and therefore may be formed on three surfaces of active area 105. Accordingly, a width of gate electrode 106 may increase in an amount approximately equal to a height of the protruded area. This may increase the amount of the drive current when compared to a flat structured MOS transistor.

The related art transistor of the semiconductor device may have various problems.

Referring to FIG. 2, for example, due to divot A that may be generated at a bottom portion of the pin during formation of the related art pin-type MOS transistor, an implementation of subsequent processes, for example, the formation of a uniform gate insulating layer, may be difficult. In addition, because of the thinning phenomenon of the gate insulating layer of portion A, device characteristics may be degraded and a short of the gate insulating layer may occur, which may reduce a reliability of the device.

SUMMARY

Embodiments relate to a method of manufacturing a semiconductor device.

In embodiments, a method of manufacturing a semiconductor device may include forming a first and a second insulating layer on a semiconductor substrate of which an active area and an isolation region are defined, forming a first and a second insulating layer pattern by selectively removing the first and the second insulating layer to expose the isolation region of the semiconductor substrate, forming a trench having a predetermined depth by selectively removing the semiconductor substrate by using the first and the second insulating layer pattern as a mask, forming an isolation layer as a third insulating layer in the trench, removing a predetermined thickness of the isolation layer from the surface portion through etching the whole semiconductor substrate while remaining at the side portions of the first and second insulating layer pattern and the active area as a side wall shape, removing the first and the second insulating layer pattern and removing a predetermined thickness of the isolation layer from the surface portion to protrude the active area of the semiconductor substrate, forming a gate electrode along a direction crossing the protruded active area while inserting a gate insulating layer between them and forming a source/drain impurity region at the protruded active area at both sides of the gate electrode.

According to embodiments, an isolation layer may be formed and protruded corner portion of an active area may be formed to have a round shape by remaining the isolation layer at the side portion of the active area as a side wall structure through implementing an etching onto the whole substrate. Therefore, the short of the gate insulating layer formed along the corner portion of the active area may be prevented to improve the reliability of the device.

DETAILED DESCRIPTION OF EMBODIMENTS

Figure 3:
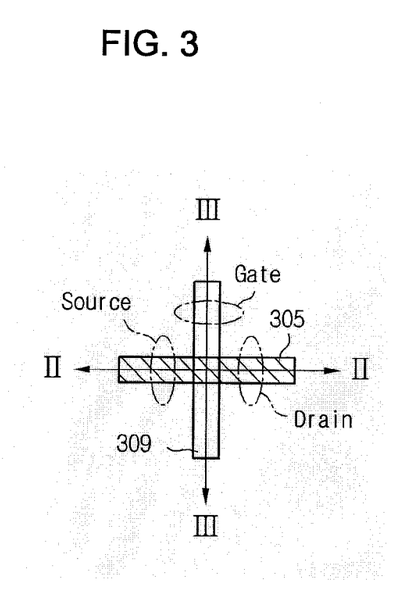
FIG. 3 is an example diagram illustrating a pin-type MOS transistor according to embodiments.
Figure 4:
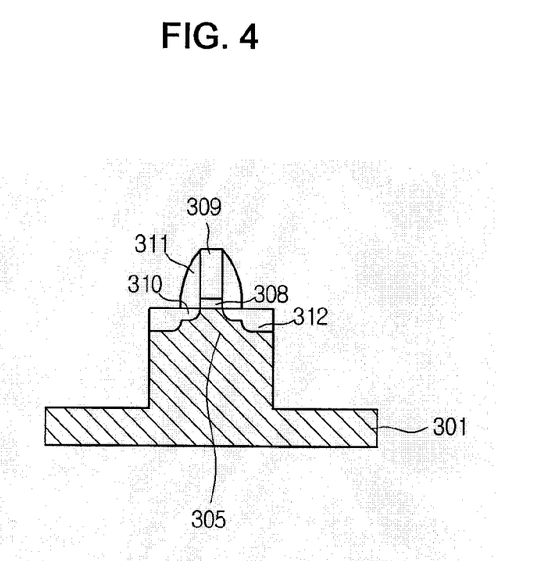
FIG. 4 is an example cross-sectional view taken along the line II-II of the pin-type MOS transistor illustrated in FIG. 3.

FIG. 3 is an example schematic diagram of a pin-type MOS transistor according to embodiments. FIG. 4 is an example cross-sectional view taken along the line II-II of the pin-type MOS transistor illustrated in FIG. 3 and FIG. 5 is a an example cross-sectional view taken along the line III-III of the pin-type MOS transistor illustrated in FIG. 3.

Figure 5:
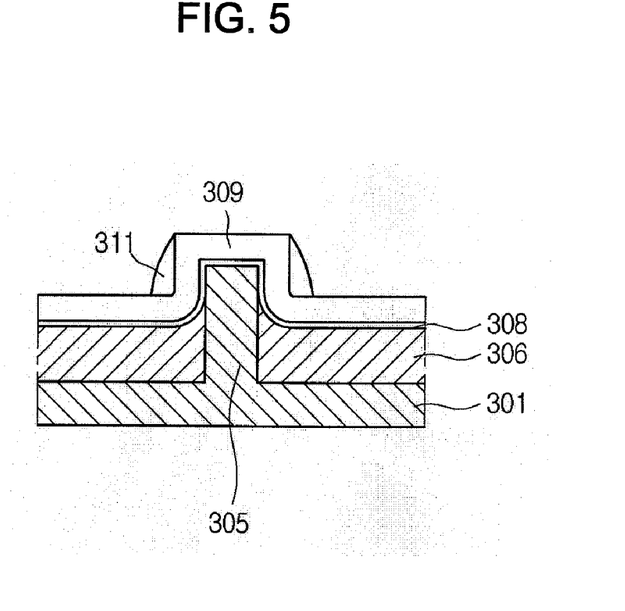
FIG. 5 is an example cross-sectional view taken along the line III-III of the pin-type MOS transistor illustrated in FIG. 3.

Referring to FIGS. 3-5, a pin-type MOS transistor according to embodiments may include active area 305 that may protrude to a prescribed height from semiconductor substrate 301 along one direction. Isolation layer 306 may be formed at sides of active area 305, and may have a lower height than active area 305. Isolation layer 306 may also have a thicker portion contacting active area 305 than the other portion on semiconductor substrate 301. Hence, isolation layer 306 may not be of uniform thickness. Gate electrode 309 may be provided along the direction vertically crossing protruded active area 305, and gate insulation layer 308 may be provided between them. Side wall spacer 311 may be formed at both sides of gate electrode 309. LDD region 310 may be formed at active area 305 at both sides of gate electrode 309. The transistor may also include source/drain impurity region 312.

In embodiments, a portion where isolation layer 306 contacts active area 305 and a corner portion of active area 305 may have a substantially rounded and/or curved shape. For example, isolation layer 306 may arc at an edge of the active area 305 where it makes contact.

FIGS. 6A-6G are example cross-sectional diagrams illustrating a method of manufacturing the pin-type MOS transistor according to embodiments.

Figure 6A:
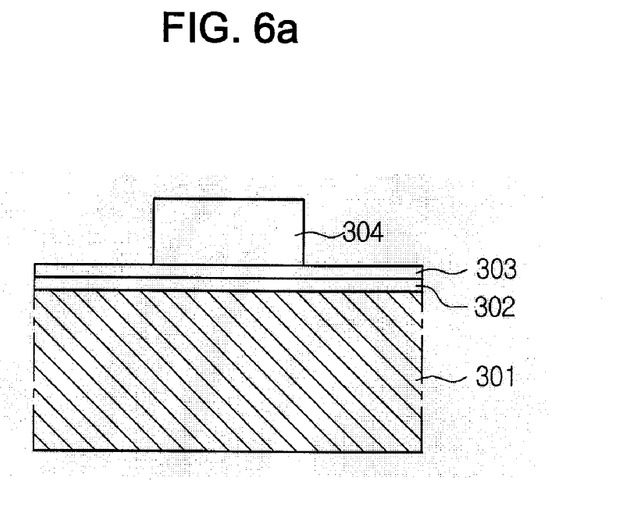
FIGS. 6A-6G are example cross-sectional diagrams illustrating a method of manufacturing a pin-type MOS transistor according to embodiments.

Referring to FIG. 6A, first insulating layer 302 and second insulating layer 303 May be sequentially formed on semiconductor substrate 301.

In embodiments, first insulating layer 302 may be formed using an oxide layer having a thickness of about 20~1 100 Å and second insulating layer 303 may be formed using a nitride layer that may have a thickness of about 500~1500 Å.

In embodiments, first insulating layer 302 and second insulating layer 303 may be formed. In embodiments, insulating layers may be formed as a single insulating layer for a hard mask.

In embodiments, photoresist layer 304 may be coated on second insulating layer 303 and may be exposed and developed to be patterned to define an isolation region and an active area.

According to embodiments, a region where photoresist layer 304 remains may become the active area, while a region where photoresist layer 304 is removed may become the isolation region.

Figure 6B:
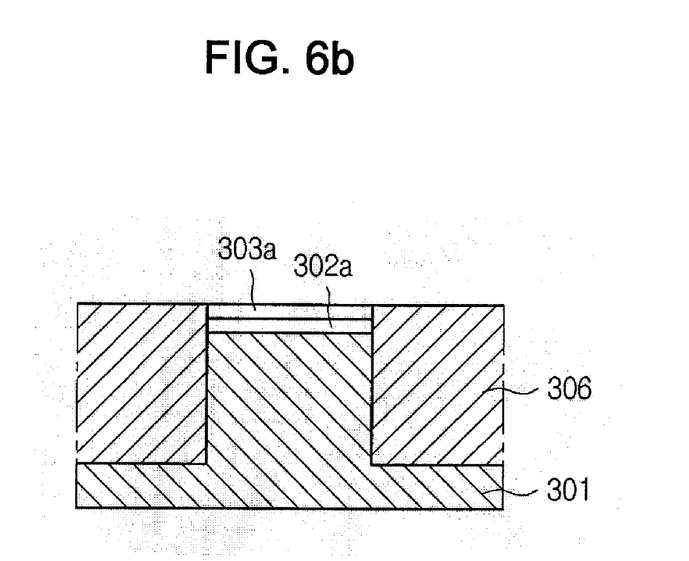

Referring to FIG. 6B, second insulating layer 303 and first insulating layer 302 may be selectively removed, for example by using patterned photoresist layer 304 as a mask, and may form first insulating layer pattern 302a and second insulating layer pattern 303a.

Photoresist layer 304 may be removed and a trench having a prescribed depth from the surface portion may be formed, for example by selectively removing the isolation region of semiconductor substrate 301 by using first insulating layer pattern 302a and second insulating layer pattern 303a as a mask.

After completing the formation of the trench at the isolation region of semiconductor substrate 301, active area 305 may protrude with a prescribed height along one direction.

In embodiments, active area 305 may be formed to protrude as a straight line shape along one direction.

In embodiments, the trench may be formed using second insulating layer pattern 303a and first insulating layer pattern 302a as a mask after removing photoresist layer 304. However, the trench may also be formed using photoresist layer 304 as a mask instead of removing photoresist layer 304.

A third insulating layer may be formed on a surface of semiconductor substrate 301, including over the trench. A CMP (chemical mechanical polishing) process may be performed on the surface of the third insulating layer using the upper surface of second insulating layer pattern 303a as an end point. Isolation layer 306 within the trench may thereby be formed.

Figure 6C:
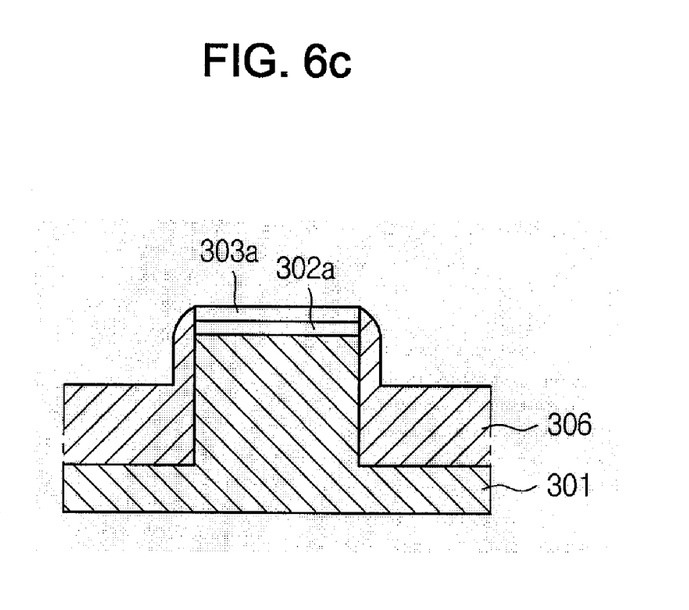

Referring to FIG. 6C, an etching process may be performed on a surface of semiconductor substrate 301, including over isolation layer 306. Isolation layer 306 may thereby be selectively removed to a prescribed thickness from the surface portion.

According to embodiments, since the third insulating layer may be formed to have a different etching ratio with respect to second insulating layer pattern 303a, isolation layer 306 adjacent to second insulating layer pattern 303a may not be removed. Instead, it may remain as a side wall shape having a prescribed thickness.

Figure 6D:
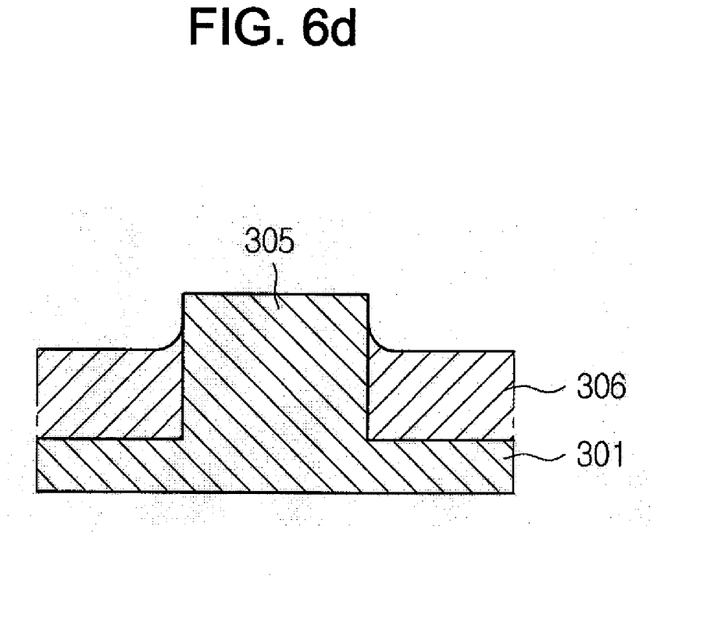

Referring to FIG. 6D, second insulating layer pattern 303a and first insulating layer pattern 302a may be removed, for example by a wet etching.

In embodiments, when removing second insulating layer pattern 303a and first insulating layer pattern 302a by the wet etching process, isolation layer 306 also may be removed to a prescribed thickness from the surface. Accordingly, active area 305 may protrude further from the upper surface of isolation layer 306.

In embodiments, second insulating layer pattern 303a may be removed, for example by using a phosphoric acid solution, and isolation layer 306 may also be selectively removed to a prescribed thickness during removing of first insulating layer pattern 302a.

A portion of isolation layer 306 that may contact protruded active area 305 may be thicker than other portions thereof and may have a substantially rounded shape. This shape may be obtained because semiconductor substrate 301 on which second insulating layer pattern 303a and isolation layer 306 may be formed, may be etched such that isolation layer 306 adjacent to active area 305 may remain as a side wall shape before a subsequent removal process is performed.

In embodiments, a portion of isolation layer 306 adjacent to active area 305 may be formed to have a greater thickness than the other portion thereof. This may prevent a generating of non-uniform deposition of a gate insulating layer or a thinning phenomenon due to a divot.

In embodiments, by forming the corner portion of protruded active area 305 having a rounding shape by applying a selective etching process or an oxidation process, a defect due to a short during depositing the subsequently formed gate insulating layer may be prevented.

Figure 6E:
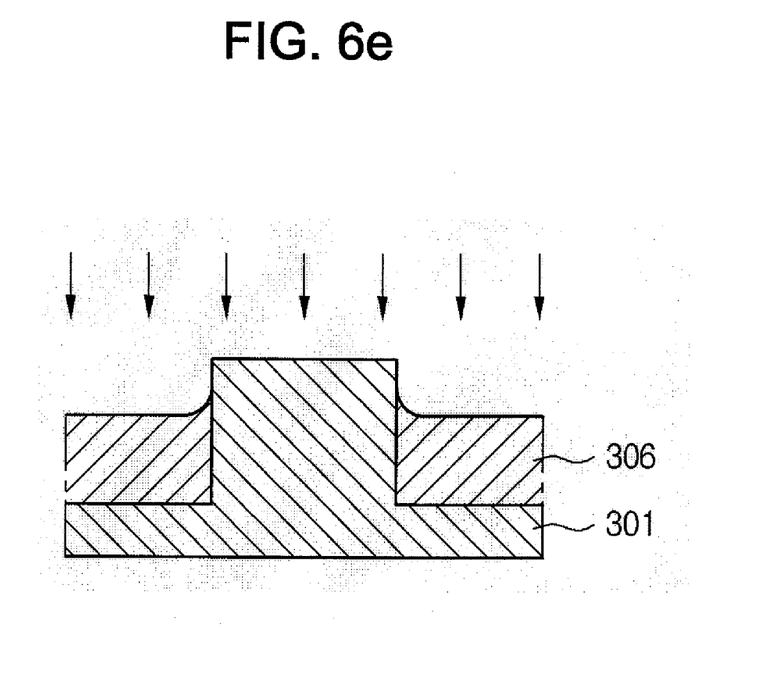

Referring to FIG. 6E, ions may be injected onto the surface of semiconductor substrate 301 for a well implant and a threshold controlling implant using an implantation method.

Figure 6F:
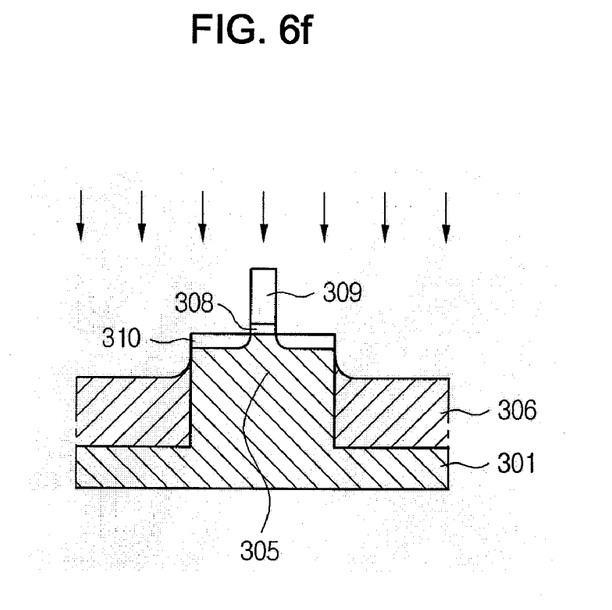

Referring to FIG. 6F, gate insulating layer 308 may be formed on the surface of semiconductor substrate 301 and a conductive layer for the gate electrode may be formed on gate insulating layer 308.

According to embodiments, gate insulating layer 308 may be formed, for example by using one of a CVD (chemical vapor deposition) method, a PVD (physical vapor deposition) method and an ALD (atomic layer deposition) method.

The conductive layer for the gate electrode may be formed by using one of TiN, Ti/TiN, WxNy and a polysilicon layer.

The conductive layer and gate insulating layer 308 may be selectively removed through a photo and an etching process. Gate electrode 309 may be formed on protruded active area 305 along a direction crossing active area 305.

LDD (lightly doped drain) region 310 may be formed at side portions of gate electrode 309 and at the surface portion of active area 305, for example through implanting low concentration n-type or p-type impurity ions onto the surface of semiconductor substrate 301 by using gate electrode 309 as a mask.

Figure 6G:
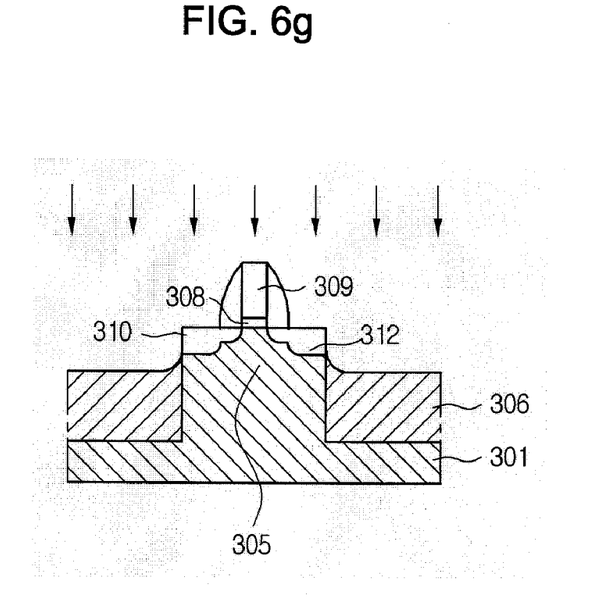

Referring to FIG. 6G, a fourth insulating layer may be formed on the surface of semiconductor substrate 301. An etch back process may be executed, and may form side wall spacer 311 at sides of gate electrode 309.

In embodiments, the fourth insulating layer may be formed using a nitride layer or by integrating an oxide layer and a nitride layer.

In embodiments, high concentration n-type or p-type impurity ions may be implanted onto the surface of semiconductor substrate 301, for example by using gate electrode 309 and side wall spacer 311 as a mask, and may form source/drain impurity region 312 at the surface portion of active area 305, at sides of gate electrode 309.

In embodiments, after forming an isolation layer and implementing an etching, the isolation layer may remain at a side portion of an active area as a side wall shape, and may change the corner portion of the protruded active area to have a substantially rounded shape. Accordingly, a short of a gate insulating layer generated along the corner portion of the active area may be prevented and a reliability of a device may be improved.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   forming a trench having a prescribed depth in a semiconductor substrate to establish a protruding active region;
   forming an isolation layer in the trench;
   removing a first prescribed portion of the isolation layer from the trench through etching, leaving a first horizontal portion of the isolation layer and side portions of the isolation layer adjacent to and contacting sides of the active region and having a side wall shape;
   removing a second prescribed portion of the isolation layer from the first horizontal portion and side portions to form a curved surface sloping from the first horizontal portion to the sides of the active region, such that the active region protrudes from the semiconductor substrate and has an isolation layer formed at sides thereof;
   sequentially forming a first and a second insulating layer on the semiconductor substrate, before defining the active region and the isolation region;
   forming a first and a second insulating layer pattern by selectively removing the first and the second insulating layer to expose the isolation region of the semiconductor substrate; and
   forming the trench having the prescribed depth by selectively removing the semiconductor substrate by using the first and the second insulating layer pattern as a mask; and
   removing the first and the second insulating layer pattern and removing a prescribed thickness of the isolation layer from the horizontal portion to form the protruding active region of the semiconductor substrate.

2. The method of claim 1, wherein the isolation layer is formed to have a first height at the horizontal portion of the isolation layer, and a second height were the isolation layer contacts the sides of the active region, the second height being greater than the first height, and a transition from the first height to the second height being a substantially concave arc, and wherein the active region has a third height greater than the second height.

3. The method of claim 1, further comprising:
   forming a gate electrode along a direction crossing the protruded active region and forming a gate insulating layer between the gate electrode and the protruded active region; and
   forming a source/drain impurity region in the protruded active region at both sides of the gate electrode.

4. The method of claim 3, further comprising forming a side wall spacer at sides of the gate electrode.

5. The method of claim 4, wherein the side wall spacer is formed by forming one of a nitride layer and an integrated oxide/nitride layer on the semiconductor substrate, including the gate electrode, and performing an etch back process.

6. The method of claim 3, wherein the gate insulating layer is formed using at least one of a CVD method, a PVD method, and an ALD method.

7. The method of claim 3, wherein the gate electrode comprises at least one of TiN, Ti/TiN, WxNy, and a poly silicone layer.

8. The method of claim 3, further comprising forming an LDD region at the protruded active region using the gate electrode as a mask.

9. The method of claim 1, wherein the first insulating layer is formed using an oxide layer to have a thickness of approximately 20~100 Å.

10. The method of claim 1, wherein the second insulating layer is formed using a nitride layer to have a thickness of approximately 500~1500 Å.

11. The method of claim 1, further comprising injecting ions for a well implant and for a threshold voltage control onto the protruded active area.

12. The method of claim 1, wherein the isolation layer is formed by forming a third insulating layer on the surface of the semiconductor substrate including the trench and performing a CMP process using the upper surface of the second insulating pattern as an etch-stop point.

13. The method of claim 12, wherein the second insulating layer pattern and the third insulating layer comprise insulating layers having different etching ratios.

14. The method of claim 1, wherein the second insulating layer pattern is removed by wet etching using a phosphoric acid solution.

15. The method of claim 1, wherein the active region and the isolation Layer are patterned to correspond to the second insulating layer pattern and have a greater width by coating photoresist over a surface of the semiconductor substrate, performing exposing and developing, and selectively etching using the patterned photoresist as a mask.

16. The method of claim 1, wherein the second insulating layer pattern and the third insulating layer are formed as insulating layers having different etching ratios.

* * * * *